(12) United States Patent
Hou et al.

(10) Patent No.: US 7,932,566 B2
(45) Date of Patent: Apr. 26, 2011

(54) STRUCTURE AND SYSTEM OF MIXING POLY PITCH CELL DESIGN UNDER DEFAULT POLY PITCH DESIGN RULES

(75) Inventors: Yung-Chin Hou, Taipei (TW); Li-Chun Tien, Tainan (TW); Lee-Chung Lu, Taipei (TW); Ping Chung Li, Hsin-Chu (TW); Ta-Pen Guo, Cupertino, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 294 days.

(21) Appl. No.: 12/347,628

(22) Filed: Dec. 31, 2008

(65) Prior Publication Data
US 2010/0164614 A1    Jul. 1, 2010

(51) Int. Cl.
*H01L 25/00* (2006.01)
(52) U.S. Cl. .................. 257/401; 257/565
(58) Field of Classification Search .......... 257/401, 257/394; 327/565
See application file for complete search history.

(56) References Cited

U.S. PATENT DOCUMENTS

| 5,534,724 A * | 7/1996 | Nagamine ............ 257/390 |
| 6,381,166 B1 * | 4/2002 | Yoshida et al. ......... 365/63 |
| 2007/0168898 A1 | 7/2007 | Gupta et al. |

OTHER PUBLICATIONS

Webb, C., "45 nm Design for Manufacturing," Intel Technology Journal, Intel's 45nm CMOS Technology, vol. 12, Issue 2, Jun. 17, 2008, pp. 121-130.

* cited by examiner

*Primary Examiner* — Roy K Potter
(74) *Attorney, Agent, or Firm* — Slater & Matsil, L.L.P.

(57) ABSTRACT

An integrated circuit including type-1 cells and a type-2 cell is presented. The type-1 cells have poly lines with a default poly pitch. The type-2 cell has poly lines with a non-default poly pitch. A first boundary region has at least one isolation area that lies between the type-1 cells and the type-2 cell in the X-direction. The first boundary region includes at least one merged dummy poly line, wherein the at least one merged dummy poly line has a first portion that complies with the default poly pitch of the type-1 cells and a second portion that complies with the non-default poly pitch of the type-2 cell.

20 Claims, 6 Drawing Sheets

STRUCTURE AND SYSTEM OF MIXING POLY PITCH CELL DESIGN UNDER DEFAULT POLY PITCH DESIGN RULES

TECHNICAL FIELD

The present invention relates generally to a layout of integrated circuit structures, and more particularly to a system and an integrated circuit layout having cells of non-default poly pitches mixed with cells of default poly pitches.

BACKGROUND

As the semiconductor industry makes improvements in transistor density, one of the challenges is controlling manufacturing variation. Control of polysilicon (poly) critical dimension (CD) is one of the critical requirements in the processing of an integrated circuit (IC), due to the poly CD affect on transistor performance. Poly CD control typically must scale for the new technology to keep the percentage variation of the channel length constant. These critical requirements often make poly the first layer to require new patterning solutions and design rules.

A known method of enhancing CD control during photolithography and etching processes is to insert dummy poly lines during the layout process. As well as aiding patterning, the dummy poly lines aid the subsequent etch process. Different consumptions of etchants due to different pattern density lead to etch skew between dense and isolated patterns. Typically, all available etchants in areas with low density are consumed rapidly, and thus the etch rate drops off significantly. To reduce this etch skew, dummy poly lines may be inserted adjacent to the primary pattern with specific spacing. Furthermore, dummy poly lines may be placed outside of active-layer regions. Dummy poly lines require correct placement to make the printability of resist and the etch processes better.

Design rules specify the constraints on a device layout. For example, design rules typically specify the smallest width feature that may be used in a layout, for example, poly line width and channel length. Further, design rules specify the smallest spacing between features that may be used to ensure that the features do not short. The pitch of regularly spaced feature lines is the distance from the first side of the first line to the first side of the next line. Thus, the pitch is the feature line width plus the intermediate space between feature lines.

Early prior art layout had loose design rules that allowed random combinations of poly widths, spaces and device orientation. As devices shrunk, the design rules changed to accommodate the use of optical proximity correction (OPC), and/or phase shift masks (PSM), and/or off axis illumination (OAI). A change in illumination technology, such as OAI to achieve minimum line width and minimum space may not allow the same scaling for wider lines, or it may make scaling different in the X and Y directions. These tools and methods work best when the layout is predictable and there are no hotspots caused by the use of unexpected combinations of design rules.

In some processes, for example if OAI is used, the photolithography process is chosen to enhance the characteristics of the most common pitches in the layout. When optimized for one pitch, the minimum or the most commonly used pitch in the design, there may be other pitches for which the photolithographic processes lead to a poor response and hence a small depth of focus/process window. These problems have lead to the development of layout cells that have a consistent poly pitch oriented in a single direction across device cells. These cells are termed default or default cells. Therefore, the design rules changed wherein poly layout rules based upon restricting poly line width, poly spacing, and orientation were implemented.

However, some circuits cannot meet the poly pitch requirement; for example, footer, header, lever shifter, and decoupling cells may require a different poly pitch. A circuit designer using a library of default poly pitch cells may need to place a non-default poly pitch cell or cells within a device layout. Confusion and device layout difficulties may arise as the circuit designer attempts to implement a non-default cell or cells into an otherwise default cell device.

What is needed then, is a new integrated circuit structure and system of accommodating mixed poly pitch cells of default and non-default cells that overcomes the above described shortcomings of the prior art.

SUMMARY OF THE INVENTION

These and other problems are generally solved or circumvented, and technical advantages are generally achieved by an integrated circuit structure and a system of intermixing default poly pitch cells and non-default poly pitch cells.

In accordance with an illustrative embodiment, an integrated circuit including type-1 cells and a type-2 cell is presented. The type-1 cells have poly lines with a default poly pitch. The type-2 cell has poly lines with a non-default poly pitch. A first boundary region has at least one isolation area that lies between the type-1 cells and the type-2 cell in the X-direction. The first boundary region includes at least one merged dummy poly line, wherein the at least one merged dummy poly line has a first portion that complies with the default poly pitch of the type-1 cells and a second portion that complies with the non-default poly pitch of the type-2 cell.

Advantages of preferred embodiments include providing rules that govern the inclusion of non-default poly cells into a default poly pitch cell device. These illustrative embodiments allow for predictability when implementing a non-default poly cell addition to default poly cells in a design layout.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely, an integrated circuit having mixed default and non-default single level poly cells. The invention may also be applied, however, to other semiconductor devices including those comprising multiple layers of poly.

Figure 1:
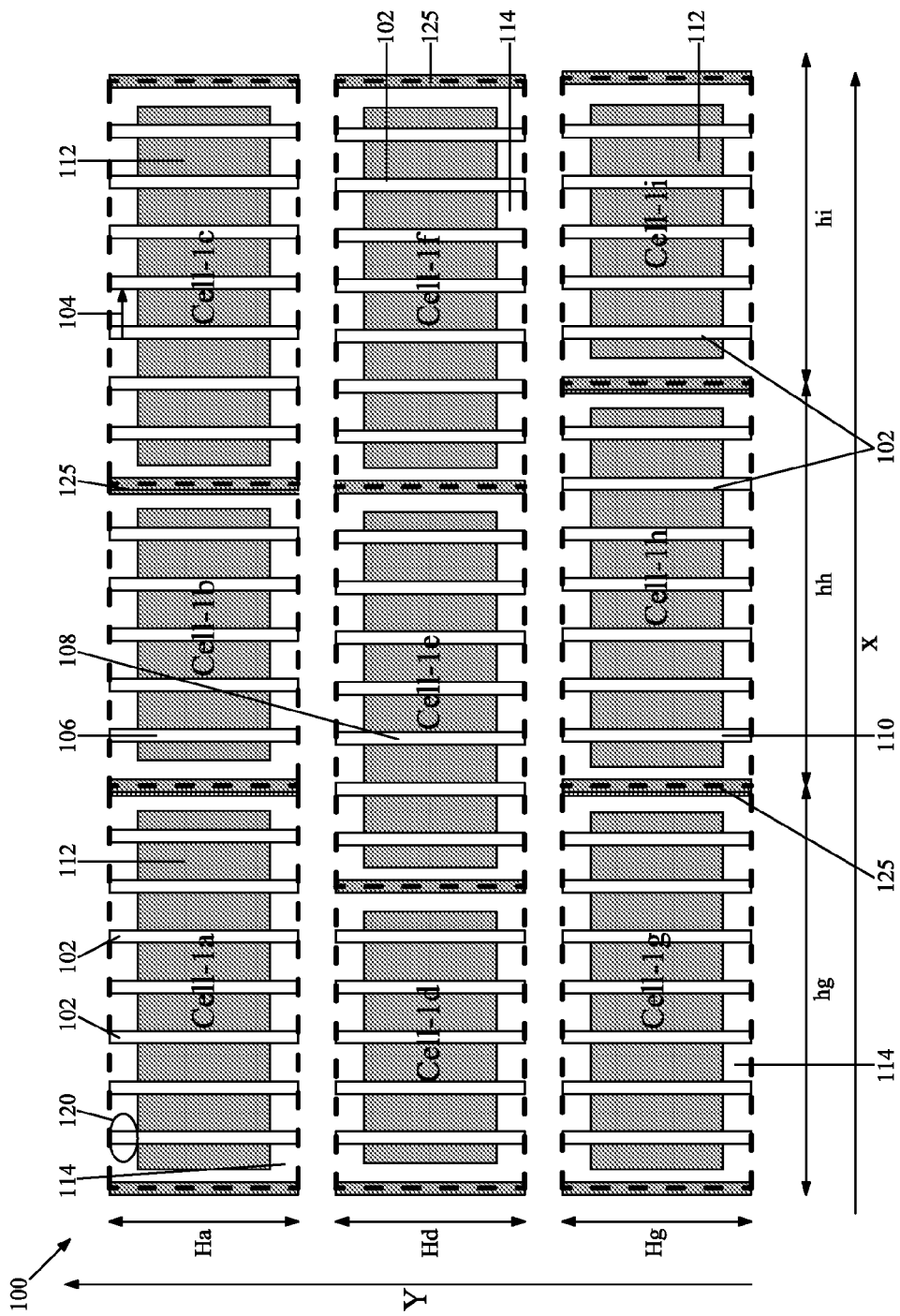
FIG. 1 is a plan view of the active and poly layers of nine default poly cells.

With reference now to FIG. 1, there is shown a plan view of the active and poly layers of nine cells. Examples of layout objects include, but are not limited to, cells, poly, active areas, isolation areas, and dummy poly lines. In an embodiment of the present invention, the cells are arranged in a plurality of rows in the layout. The exemplary layout 100 shown in FIG. 1 includes default poly cells from, for example, a cell library. Default poly refers to the poly pitch of the majority of the device cells. The poly pitch is restricted to a particular pitch in the cells of the library and/or the cells of the device. The restricted pitch then becomes the default pitch for the cell, device, or library. Any cell with a different pitch is then a non-restricted or non-default cell. Each cell, Cell 1a-Cell 1i, is a type-1 or default poly cell. Each cell has an isolation area boundary enclosing all the active and poly shapes (dashed line). These cell boundaries abut in the X-direction. Cell height is in the Y-direction and cell width is in the X-direction. The cell height "H" of Cell-1a, Cell-1d, and Cell-1g are Ha, Hd, and Hg respectively. The cell widths "W" of Cell-1g, Cell-1h, and Cell-1i are Wg, Wh, and Wi respectively. Note that each type-1 cell is an even multiple of the default poly pitch.

Cells 1a-1i are type-1 (default) cells. Poly lines 102 in each cell have the same poly pitch, such as poly pitch 104 indicated in Cell-1c and are oriented the same direction. Further, from cell-to-cell the poly lines are aligned one above the other in the Y-direction, such as poly lines 106 in Cell-1b, 108 in Cell-1e, and 110 in Cell-1h, for example. Of course, those of ordinary skill in the art will appreciate that FIG. 1 shows a small sample of the number of cells that may be found in a device layout. Moreover, more than one type-2 cell may be placed in the layout. Further, cells in a layout may include many active-layer regions, such as 112 in Cell-1a, Cell-1c, and Cell-1i, for example. Outside of active-layer regions 112 are field or isolation regions, such as 114 in Cell-1a, Cell-1f, and Cell-1g, for example. Poly lines may further include gate poly lines and/or shapes that are poly over an active-layer, and field poly lines and/or shapes that are typically over isolation regions 120. Dummy poly lines, such as dummy poly lines 125 may be placed in the boundary regions of the cells, as shown, for example, between Cell-1b and Cell-1c, on the boundary area of Cell-1f, and between Cell-1g and Cell-1h.

Typically, placement of dummy poly lines 125 is chosen according to a system of rules defined by device engineering, and implemented by resolution enhancement technique (RET) tools. Exemplary tools may include Calibre™ from Mentor Graphics and Proteus™ from Synopsys. Dummy poly lines 125 may be placed after the placement of cells in the layout. However, the scope of these embodiments is not so limited.

Figure 2:
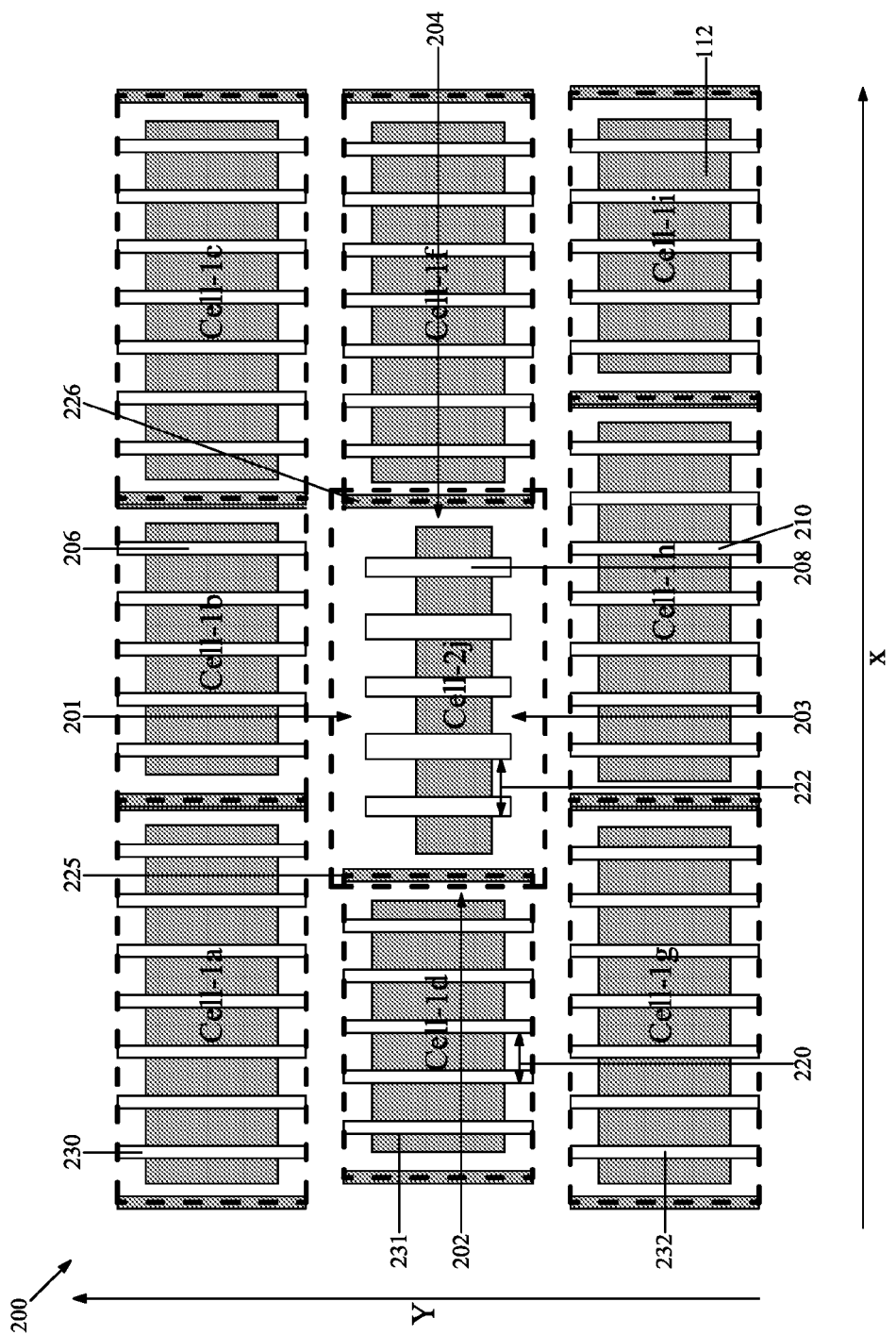
FIG. 2 shows a plan view of the active and poly layers of nine cells.

FIG. 2 shows a plan view of the active and poly layers of nine cells. Sample layout 200 is a mixed type-1 (default) and type-2 (non-default) layout. Sample layout 200 shows Cell-2j, which is a non-default poly cell, as well as Cells-1a, 1b, 1c, 1d, 1f, 1g, 1h, and 1i, which are default poly cells. The boundary areas for Cell-2j are labeled 201, 202, 203, and 204 as indicated.

Boundary areas 202 and 204 are boundary areas in the X-direction of layout 200 and boundary areas 201 and 203 are boundary areas in the Y-direction of layout 200. Looking first at boundary areas 202 and 204, it is obvious from FIG. 2 that the type-1 poly pitch 220 (illustrated in Cell-1d) differs from the type-2 poly pitch 222 (illustrated in Cell-2j). Dummy poly lines 225 and 226 do comply with type-1 (default) poly rules, with poly pitch 220 in the X-direction, however poly line 225 does not comply with the default poly rules in the Y-direction. The mismatch occurs because Cell-2j is not a multiple of type-1 poly pitch 220 and therefore does not allow surrounding cells to align to their respective neighboring type-1 cells.

As is obvious from FIG. 2, poly line 230 of Cell-1a is not aligned in the Y-direction with poly line 231 of Cell-1d, and poly line 232 of Cell-1g is not aligned with poly line 231, despite the fact that those cells are type-1 default cells. Therefore, Cell-1a, Cell-1d, and Cell-1g are non-compliant with the default poly cell rules. Further, the boundary areas 201 and 203 in the Y-direction may be too narrow in sample layout 200. The narrow boundary 201 and 203 allow non-compliant poly lines in the Y-direction to be in close proximity. Poly line 206 in Cell-1b is not aligned with poly line 208 in Cell-2j, nor is poly line 210 in Cell-1h aligned with poly line 208. Therefore, the space left between the cells may be insufficient for reliable poly patterning and etch and poly shorts may result.

Figure 3:
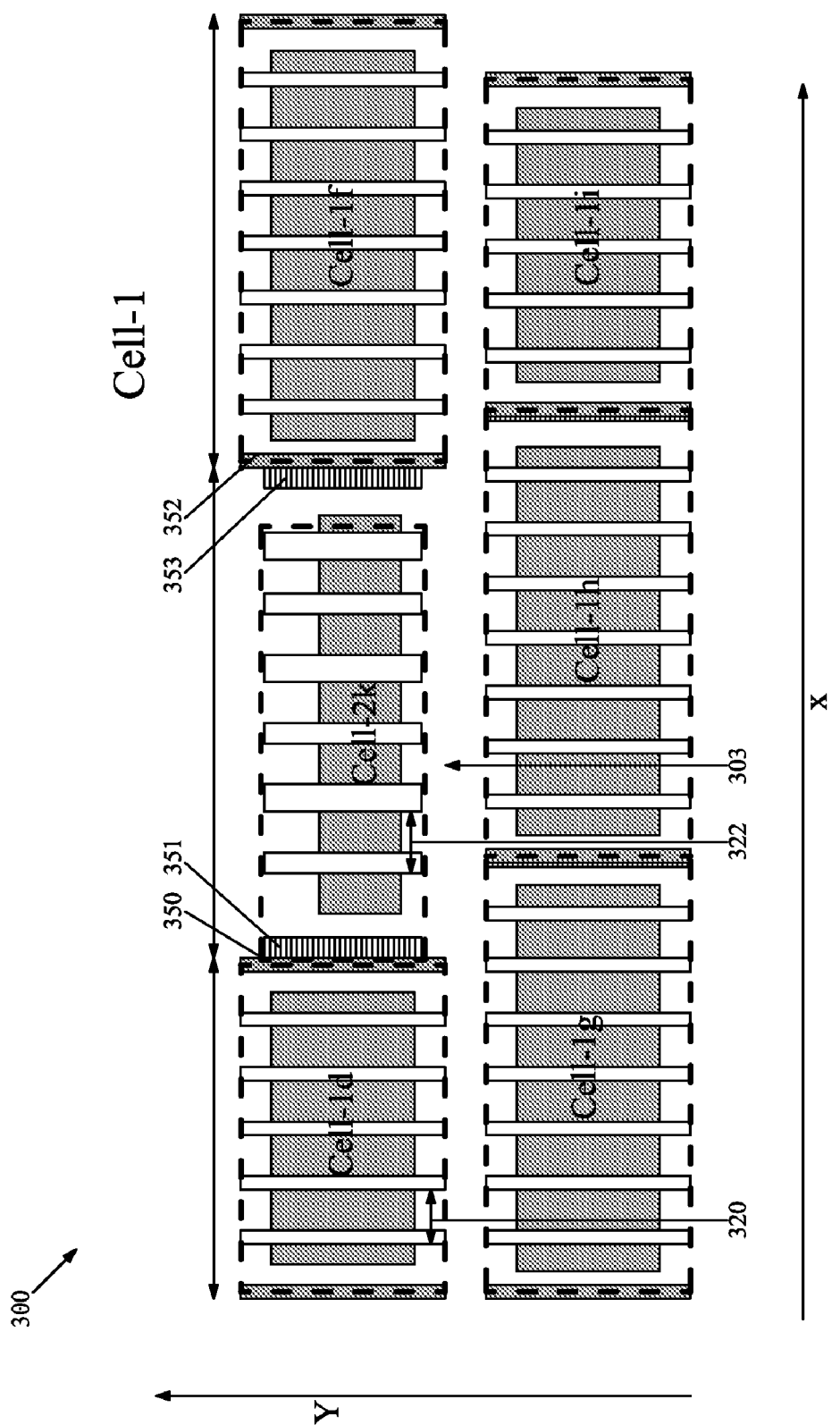
FIG. 3 shows a plan view of the active and poly layers of six cells according to an aspect of an illustrative embodiment.

FIG. 3 shows a plan view of active and poly layers of six cells according to an aspect of an illustrative embodiment. To simplify FIG. 3, only six cells are shown in example layout 300. Firstly, the type-2 cell, Cell-2k, is designed to be a multiple of the type-1 poly pitch 320, wherein a multiple is a number that contains another number an integral number of times without a remainder. In example layout 300, Cell-2k is 10 times the type-1 poly pitch 320. Creating a type-2 cell which is a multiple of the type-1 poly pitch is an advantage in that it complies with neighboring cells Cell-1d, Cell-1g, and Cell-1a (not shown) of the default poly design rules, so that the poly lines are aligned in the Y-direction.

Further, the isolation area in the Y-direction 303 allows poly line to poly line spacing to be increased. This feature of the illustrative embodiment has the advantage of minimizing or eliminating poly to poly shorts from cells adjacent in the Y-direction to a type-2 cell, such as Cell-2k, in FIG. 3. While the poly lines do not align in the Y-direction between Cell-2k and Cell-1h, the distance between the poly lines is sufficient to prevent bridging between the cells. Dummy poly lines, such as poly line 350 and poly line 352 are added in the boundary regions between a type-2 cell and any X-direction type-1 cells juxtaposed to the type-2 cell, such as Cell-1*d* and Cell-1*f*.

Moreover, a type-2 dummy poly line 351 and/or 353 may be added in the boundary region on either or both sides of the type-2 cell complying with non-default poly pitch 322. The type-2 poly pitch 322 thus extends into the isolation region of the type-2 boundary area. The extension of type-2 pitch 322 into isolation region 303 may allow a more reliable patterning and etch of the poly lines that are disposed on active regions in Cell-2*k*. Accurate patterning and etch of the active regions are typically critical to device function. The two poly lines juxtaposed may be merged into one poly line wherein a first portion of the merged poly line complies with the poly pitch of the type-1 cells and a second portion of the merged poly line complies with the poly pitch of the type-2 cell. In other words, during the layout stage the two cells may have no gap between them or may be overlain one on top of the other. Thus, the two cells may merge into one rectilinear shape rather than two distinct rectangular shapes. This is an advantage of an illustrative embodiment in that space on the semiconductor layout is saved by overlaying the merged poly lines.

Figure 4:
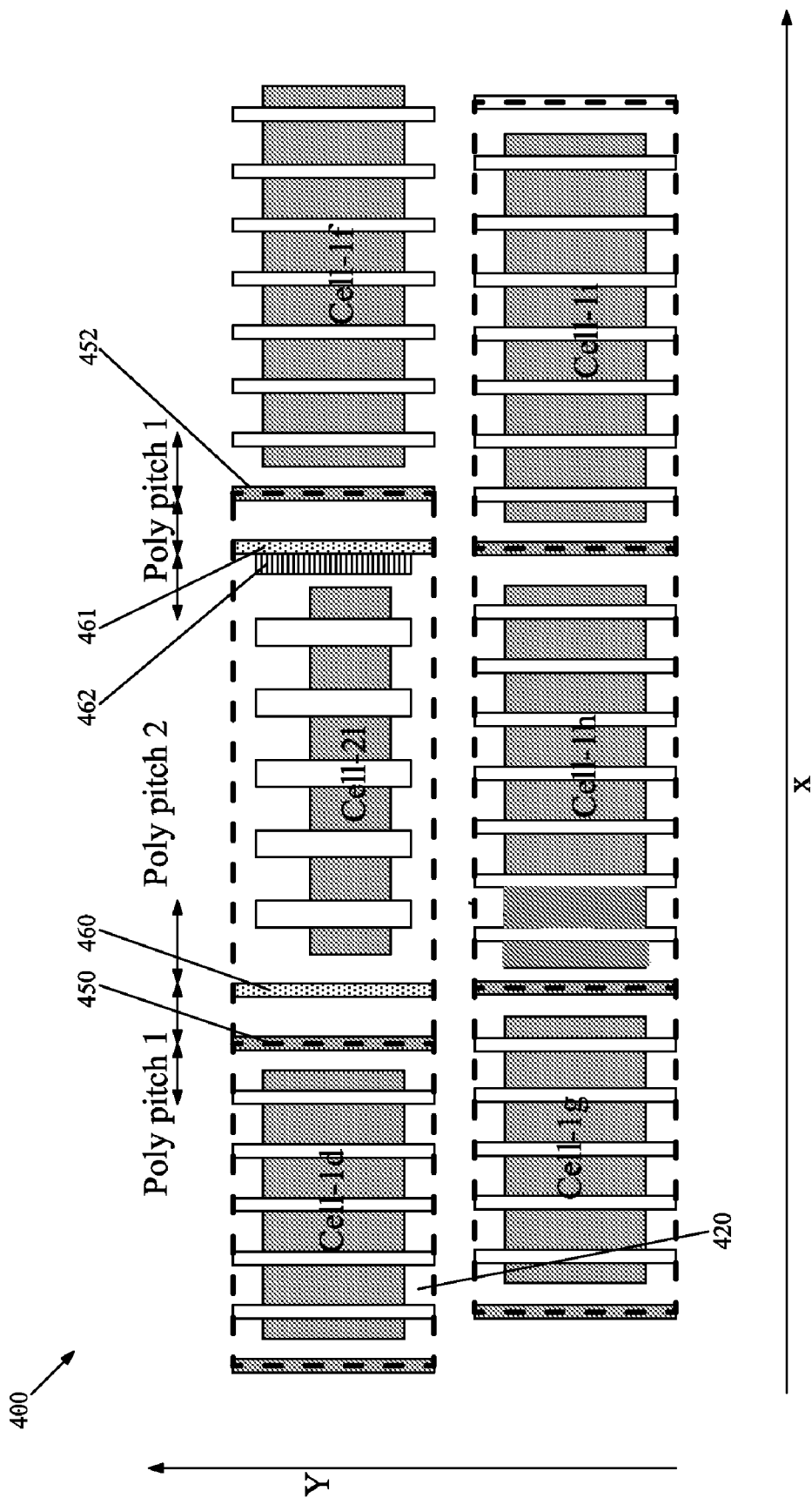
FIG. 4 shows a plan view of the active and poly layers of six cells according to another aspect of an illustrative embodiment.

FIG. 4 shows a plan view of active and poly layers of six cells according to yet another illustrative embodiment. In sample layout 400, Cell-21 has a width that is a multiple of the default poly pitch of a type-1 cell, plus additional area in which to place additional dummy poly lines within the type-2 cell. Cell-21 in sample layout 400 is II times the type-1 poly pitch 420. Default dummy poly lines 450 and 452 are placed in the boundaries between type-2 Cell-11 and type-1 Cell-2*d*, and Cell-1*f*, respectively. Default dummy poly lines 460 and 461 are placed within a type-2 cell, such as is shown in Cell-21 in sample layout 400. Furthermore, a non-default dummy poly line 462 is juxtaposed to default dummy poly line 461, in the embodiment illustrated. In another embodiment, both or either of default dummy poly lines 460 and 461 may have a non-default poly line juxtaposed. In the final layout, non-default dummy poly lines that are juxtaposed to default dummy poly lines may be merged into one large poly line, such as the combination of lines 461 and 462 in sample layout 400. Note in sample layout 400 that the poly pitch for the type-1 cell is continued to within the edges of the type-2 cell. Further, note that the spacing in the Y-direction between the cells is expanded to protect against poly shorting. The cell layout has the larger vertical spacing built in, therefore, no matter where cell-2*l* is placed there will be a larger vertical spacing between the poly lines in cell 2*l* and its upper and lower neighboring cells.

Figure 5:
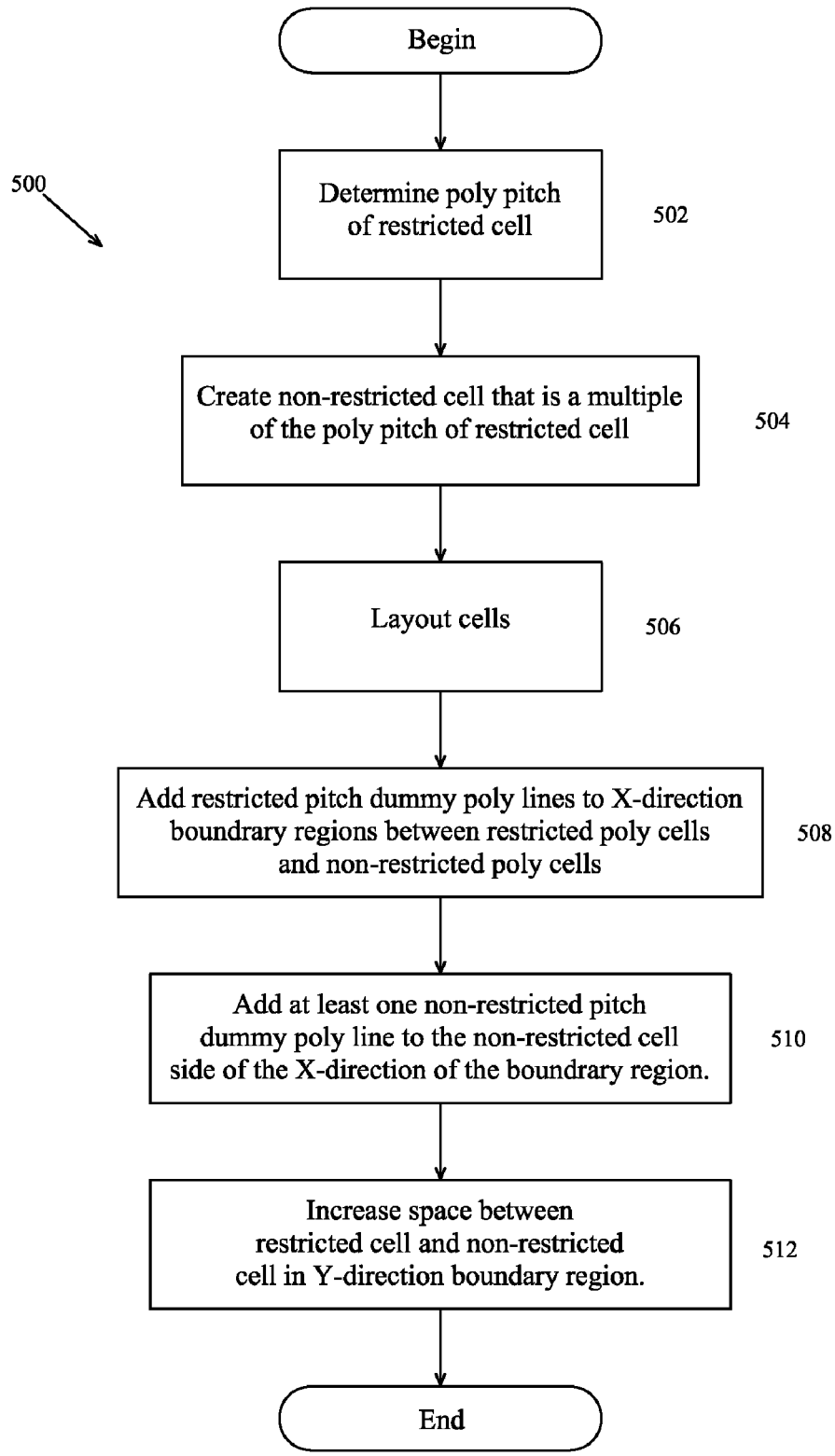
FIG. 5 is a flow chart of a system for accommodating a non-default cell within a predominantly default cell device layout according to an illustrative embodiment.

FIG. 5 is a flow chart of a system for accommodating a cell with mismatched poly lines (non-default poly pitch) in a default poly device in accordance with an illustrative embodiment. Process 500 begins by determining the default poly pitch of the type-1 (default) cells (step 502). A type-2 (non-default) cell is created that is a multiple of the default poly pitch (step 504). The type-1 cells and the type-2 cell or cells are laid out in the device layout (step 506). While the embodiment illustrated shows one type-2 cell, those of ordinary skill in the art will appreciate that multiple type-2 cells may be placed in the layout.

Default poly pitch dummy poly lines are placed in the X-direction boundary regions between the type-1 cells and the type-2 cell (step 508). At least one non-default poly pitch dummy poly line is merged with the default poly pitch dummy poly line in the X-direction boundary region (step 510). The type-2 cell area may be increased in the X-direction since larger vertical poly line spacing is required when abutting the type-1 cell. Further, type-2 cells may need more poly lines to meet performance needs. Thus, the type-2 cell may likely be wider in the X-direction than shown herein. The poly lines within type-2 cells may be shorter by design to provide more isolation space to its vertical neighboring poly lines (step 512). Thus, process 500 ends.

Figure 6:
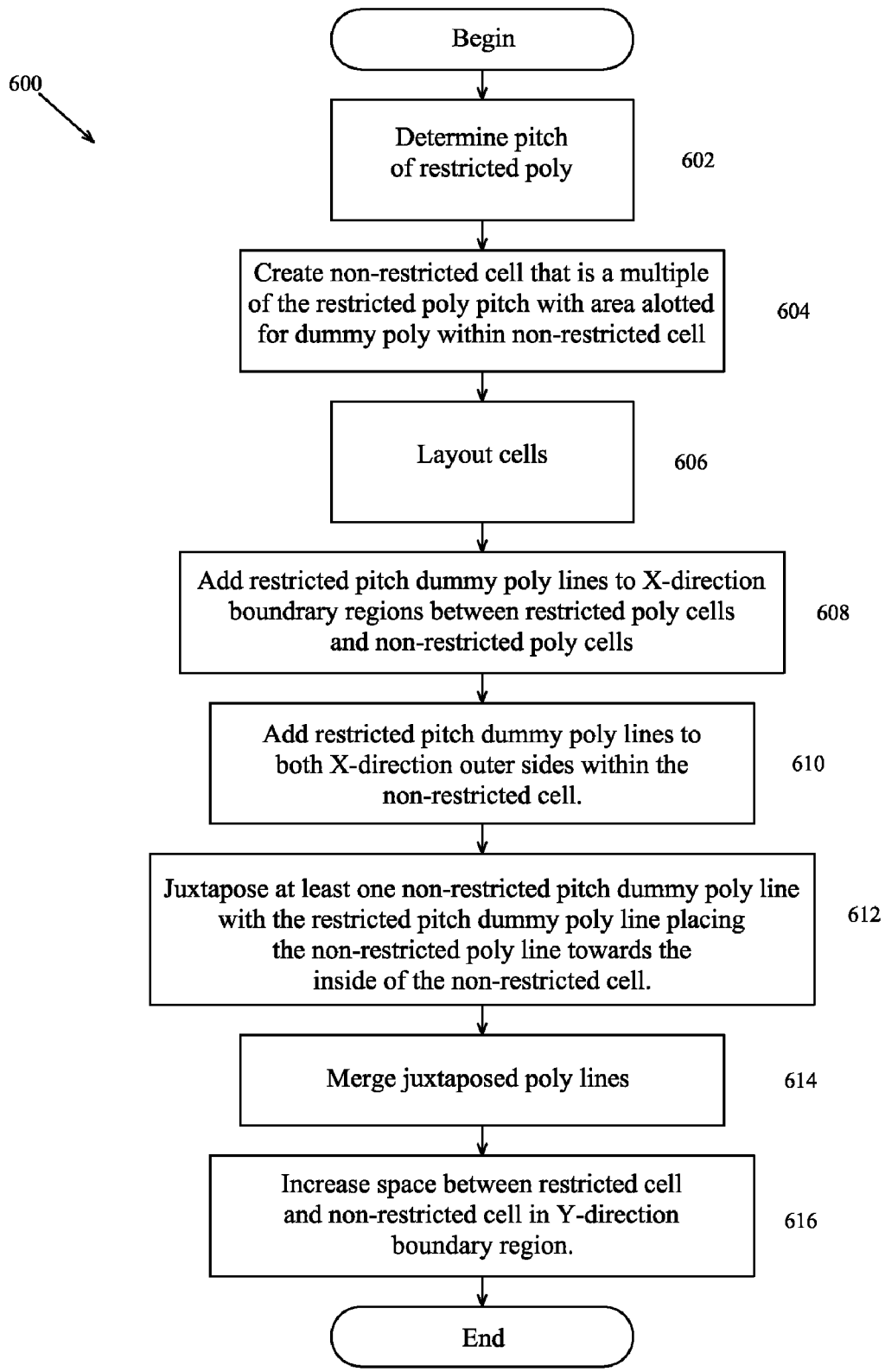
FIG. 6 is a flow chart of a system for accommodating a non-default cell within a predominantly default cell device layout according to another illustrative embodiment.

FIG. 6 is a flow chart of a system for accommodating a cell with mismatched poly lines (a non-default poly pitch) in a type-1 device in accordance with another illustrative embodiment. Process 600 begins by determining the poly pitch of the type-1 cells (step 602). A type-2 cell that is a multiple of the default poly pitch of the type-1 cell is created with additional area allotted for dummy poly lines within the non-default cell (step 604). Both the type-1 and type-2 cells are placed in the device layout (step 606). Default poly pitch dummy poly lines are added to X-direction boundary regions between type-1 cells and type-2 cells (step 608). Default poly pitch dummy poly lines are added within the type-2 cell (step 610) neighboring to boundary dummy poly lines. An at least one non-default poly pitch dummy poly line is placed abutted against the default poly pitch dummy poly lines placed within the type-2 cell (step 612). The abutted dummy poly lines are merged (step 614). The area between the type-1 cells and the type-2 cell in Y-direction boundary region is increased (step 616). Thus, process 600 ends.

Although the illustrative embodiment and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that the level of poly may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   type-1 cells, the type-1 cells having poly lines with a default poly pitch;
   a type-2 cell, the type-2 cell having poly lines with a non-default poly pitch; and
   a first boundary region, comprising at least one isolation area in a first direction, between at least one type-1 cell and the type-2 cell, the first boundary region having at least one merged dummy poly line, wherein the at least one merged dummy poly line has a first portion that complies with the poly pitch of the type-1 cells and a second portion that complies with the poly pitch of the type-2 cell.

2. The integrated circuit of claim 1, wherein a width of the type-2 cell is a multiple of the default poly pitch.

3. The integrated circuit of claim 1 further comprising a second dummy poly line within the first boundary region, making all active poly lines in type-1 cells bordering the first boundary region compliant with default poly pitch rules.

4. The integrated circuit of claim 1, wherein the type-2 cell has the first boundary region on two sides and each of the two sides has a merged dummy poly line.

5. The integrated circuit of claim 1, further comprising a second boundary region having an expanded isolation area, in a second direction perpendicular to the first direction, between at least one type-1 cell and the type-2 cell, wherein the expanded isolation area is cell height multiplied by default poly pitch.

6. An integrated circuit comprising:
   type-1 cells, the type-1 cells having poly lines with a default poly pitch;
   a type-2 cell, the type-2 cell having poly lines with a non-default poly pitch; and
   a first boundary region, comprising an isolation area, in a first direction, between an at least one type-1 cell and the type-2 cell, the first boundary region having boundary dummy poly lines that comply with the default poly pitch of the type-1 cells.

7. The integrated circuit structure of claim 6, further comprising a second dummy poly line within the type-2 cell, making active poly lines in type-1 cells bordering the type-2 cell compliant with default poly pitch of the type-1 cells.

8. The integrated circuit structure of claim 6, wherein a width of the type-2 cell is a multiple of the default poly pitch of the type-1 cells.

9. The integrated circuit structure of claim 6, further comprising a merged dummy poly line within the type-2 cell that has a first portion complying with the default poly pitch of the type-1 cell and a second portion complying with the non-default poly pitch of the type-2 cell.

10. The integrated circuit structure of claim 6, further comprising two merged dummy poly lines each dummy poly line having a first portion complying with the default poly pitch of the type-1 cell and a second portion complying with the non-default poly pitch of the type-2 cell.

11. The integrated circuit structure of claim 6, further comprising a second boundary region having an expanded isolation area, in a second direction perpendicular to the first direction, between poly lines in type-1 cells and poly lines in type-2 cells, wherein the expanded isolation area is cell height multiplied by default poly pitch.

12. A layout system for integrated circuits, the system comprising:
   positioning type-1 cells in a device layout, the type-1 cells having a default poly pitch; and
   positioning a type-2 cell in the device layout, the type-2 cell having non-default poly pitch, wherein the type-2 cell has a width that is a multiple of the default poly pitch of the type-1 cells.

13. The system of claim 12 further comprising:
   placing at least one default poly pitch dummy poly line in an at least one X-direction boundary region between the type-1 cells and the type-2 cell.

14. The system of claim 12 further comprising:
   placing at least one merged dummy poly line in an at least one X-direction boundary region between the type-1 cells and the type-2 cell, wherein the at least one merged dummy poly line has a first portion complying with a default poly pitch and a second portion complying with a non-default poly pitch.

15. The system of claim 12 further comprising:
   placing a merged dummy poly line in both X-direction boundary regions between the type-1 cells and the type-2 cell, wherein the merged dummy poly line has a first portion complying with a default poly pitch and a second portion complying with a non-default poly pitch.

16. The system of claim 12 further comprising:
   increasing an isolation area between the type-1 cells and the type-2 cell in at least one Y-direction boundary region.

17. The system of claim 12 further comprising:
   placing default poly pitch dummy poly lines to X-direction boundary regions between the type-1 poly cells and the type-2 poly cell.

18. The system of claim 17 further comprising:
   placing default poly pitch dummy poly lines within the type-2 cell.

19. The system of claim 18 further comprising abutting an at least one non-default poly pitch dummy poly line with the default poly pitch dummy poly line.

20. The system of claim 19 further comprising:
   merging all abutted dummy poly lines.

* * * * *